US007715256B2

(12) United States Patent
Martin

(10) Patent No.: US 7,715,256 B2
(45) Date of Patent: *May 11, 2010

(54) ACTIVE TERMINATION CIRCUIT AND METHOD FOR CONTROLLING THE IMPEDANCE OF EXTERNAL INTEGRATED CIRCUIT TERMINALS

(75) Inventor: Chris G. Martin, Boise, ID (US)

(73) Assignee: Round Rock Research, LLC, Mount Kisco, NY (US)

( * ) Notice: Subject to any disclaimer, the term of this patent is extended or adjusted under 35 U.S.C. 154(b) by 827 days.

This patent is subject to a terminal disclaimer.

(21) Appl. No.: 11/329,596

(22) Filed: Jan. 10, 2006

(65) Prior Publication Data

US 2006/0109723 A1 May 25, 2006

Related U.S. Application Data

(60) Continuation of application No. 10/999,771, filed on Nov. 29, 2004, now Pat. No. 7,106,638, which is a division of application No. 10/762,605, filed on Jan. 21, 2004, now Pat. No. 6,944,071, which is a continuation of application No. 10/375,639, filed on Feb. 6, 2003, now Pat. No. 6,711,073, which is a division of application No. 09/997,156, filed on Nov. 28, 2001, now Pat. No. 6,657,906.

(51) Int. Cl.
*G11C 7/00* (2006.01)
(52) U.S. Cl. .................. 365/198; 365/181; 327/77; 327/540
(58) Field of Classification Search ............... 365/198, 365/87, 181; 327/530, 77
See application file for complete search history.

(56) References Cited

U.S. PATENT DOCUMENTS 5,097,149 A    3/1992 Lee .......................... 307/443

(Continued)

FOREIGN PATENT DOCUMENTS

EP          0 978 943       2/2000

(Continued)

OTHER PUBLICATIONS

Gabara, Thaddeus J., et al., "Digitally Adjustable Resistors in CMOS for High-Performance Applications," IEEE Journal of Solid-State Circuits, vol. 27, No. 8, Aug. 1992, pp. 1176-1185.

*Primary Examiner*—Thinh T Nguyen
(74) *Attorney, Agent, or Firm*—Lerner, David, Littenberg, Krumholz & Mentlik, LLP

(57) ABSTRACT

An active termination circuit is used to set the input impedance of a plurality of input terminals. Each of the input terminals is coupled to a supply voltage through at least one PMOS transistor and to ground through at least one NMOS transistor. The impedances of the transistors are controlled by a control circuit that generates a first control signal to set the impedance of another PMOS transistor to be equal to a first predetermined resistance, and generates a second control signal to set the impedance of another NMOS transistor to be equal to a second predetermined resistance. The first control signal is used to control all of the PMOS transistors and the second control signal is used to control all of the NMOS transistors. As a result the PMOS and NMOS transistors coupled to each input terminal have impedances corresponding to the first and second resistances, respectively.

14 Claims, 6 Drawing Sheets

U.S. PATENT DOCUMENTS

| | | | | |
|---|---|---|---|---|
| 5,099,148 | A | 3/1992 | McClure et al. | 307/443 |
| 5,128,560 | A | 7/1992 | Chern et al. | 307/475 |
| 5,134,311 | A | 7/1992 | Biber et al. | 307/270 |
| 5,274,276 | A | 12/1993 | Casper et al. | 307/443 |
| 5,357,156 | A | 10/1994 | Herrington | 307/542 |
| 5,576,656 | A | 11/1996 | McClure | 327/538 |
| 5,594,373 | A | 1/1997 | McClure | 327/108 |
| 5,606,275 | A | 2/1997 | Farhang et al. | 327/108 |
| 5,617,064 | A | 4/1997 | Gorecki | 333/22 R |
| 5,729,152 | A | 3/1998 | Leung et al. | 326/21 |
| 5,732,027 | A | 3/1998 | Arcoleo et al. | 365/189.05 |
| 5,754,480 | A | 5/1998 | Sato | 365/189.05 |
| 5,831,467 | A | 11/1998 | Leung et al. | 327/319 |
| 5,834,951 | A | 11/1998 | Klein | 327/53 |
| 5,864,506 | A | 1/1999 | Arcoleo et al. | 365/189.05 |
| 5,903,504 | A | 5/1999 | Chevallier et al. | 365/207 |
| 5,926,031 | A | 7/1999 | Wallace et al. | 326/30 |
| 5,949,254 | A | 9/1999 | Keeth | 326/87 |
| 5,995,443 | A | 11/1999 | Farmwald et al. | 365/233 |
| 6,026,456 | A | 2/2000 | Ilkbahar | 710/101 |
| 6,060,907 | A | 5/2000 | Vishwanthaiah et al. | 326/87 |
| 6,066,977 | A | 5/2000 | Felton et al. | 327/390 |
| 6,069,504 | A | 5/2000 | Keeth | 327/108 |
| 6,087,853 | A | 7/2000 | Huber et al. | 326/83 |
| 6,166,563 | A | 12/2000 | Volk et al. | 326/87 |
| 6,198,307 | B1 | 3/2001 | Garlepp et al. | 326/83 |
| 6,222,388 | B1 | 4/2001 | Bridgewater | 326/86 |
| 6,236,255 | B1 | 5/2001 | Oguri | 327/310 |
| 6,288,563 | B1 | 9/2001 | Muljono et al. | 326/27 |
| 6,307,424 | B1 | 10/2001 | Lee | 327/530 |
| 6,307,791 | B1 | 10/2001 | Otsuka et al. | 365/189.05 |
| 6,323,687 | B1 | 11/2001 | Yano | 326/83 |
| 6,326,802 | B1 | 12/2001 | Newman et al. | 326/30 |
| 6,330,194 | B1 | 12/2001 | Thomann et al. | 365/189.05 |
| 6,339,351 | B1 | 1/2002 | Ang et al. | 327/170 |
| 6,351,138 | B1 | 2/2002 | Wong | 326/30 |
| 6,351,421 | B1 | 2/2002 | Merritt | 365/189.11 |
| 6,359,465 | B1 | 3/2002 | Hui | 326/30 |
| 6,373,276 | B1 | 4/2002 | Hui | 326/30 |
| 6,388,495 | B1 | 5/2002 | Roy et al. | 327/309 |
| 6,420,913 | B1 | 7/2002 | Ang et al. | 327/108 |
| 6,424,169 | B1 | 7/2002 | Partow et al. | 326/30 |
| 6,445,245 | B1 | 9/2002 | Schultz et al. | 327/541 |
| 6,445,316 | B1 | 9/2002 | Hsu et al. | 341/120 |
| 6,456,124 | B1 | 9/2002 | Lee et al. | 327/108 |
| 6,459,320 | B2 | 10/2002 | Lee | 327/310 |
| 6,466,487 | B1 | 10/2002 | Otsuka | 365/189.05 |
| 6,480,798 | B2 | 11/2002 | Lee | 702/107 |
| 6,496,037 | B1 | 12/2002 | Bertin et al. | 326/82 |
| 6,501,306 | B1 | 12/2002 | Kim et al. | 327/112 |
| 6,545,522 | B2 | 4/2003 | Mughal et al. | 327/334 |
| 6,549,036 | B1 | 4/2003 | Lee | 326/83 |
| 6,552,959 | B2 | 4/2003 | Yamauchi et al. | 365/233 |
| 6,563,337 | B2 | 5/2003 | Dour | 326/30 |
| 6,643,789 | B2 | 11/2003 | Mullarkey | 713/401 |
| 6,657,906 | B2 * | 12/2003 | Martin | 365/198 |
| 6,700,418 | B2 | 3/2004 | Yu et al. | 327/108 |
| 6,711,073 | B2 | 3/2004 | Martin | 365/198 |
| 6,885,226 | B2 | 4/2005 | Waldrop | 327/112 |
| 6,965,529 | B2 | 11/2005 | Zumkehr et al. | 365/189.05 |
| 7,084,662 | B1 | 8/2006 | Om et al. | 326/30 |
| 7,106,638 | B2 * | 9/2006 | Martin | 365/198 |
| 7,187,601 | B2 | 3/2007 | Martin | 365/198 |
| 2004/0017696 | A1 | 1/2004 | Allen et al. | 365/189.05 |
| 2004/0141380 | A1 | 7/2004 | Kim et al. | 365/189.05 |
| 2006/0109722 | A1 | 5/2006 | Martin | 365/198 |
| 2006/0125516 | A1 | 6/2006 | Blodgett | 326/30 |

FOREIGN PATENT DOCUMENTS

| | | |
|---|---|---|
| WO | 95/24089 | 9/1995 |
| WO | 01/54273 | 7/2001 |

* cited by examiner

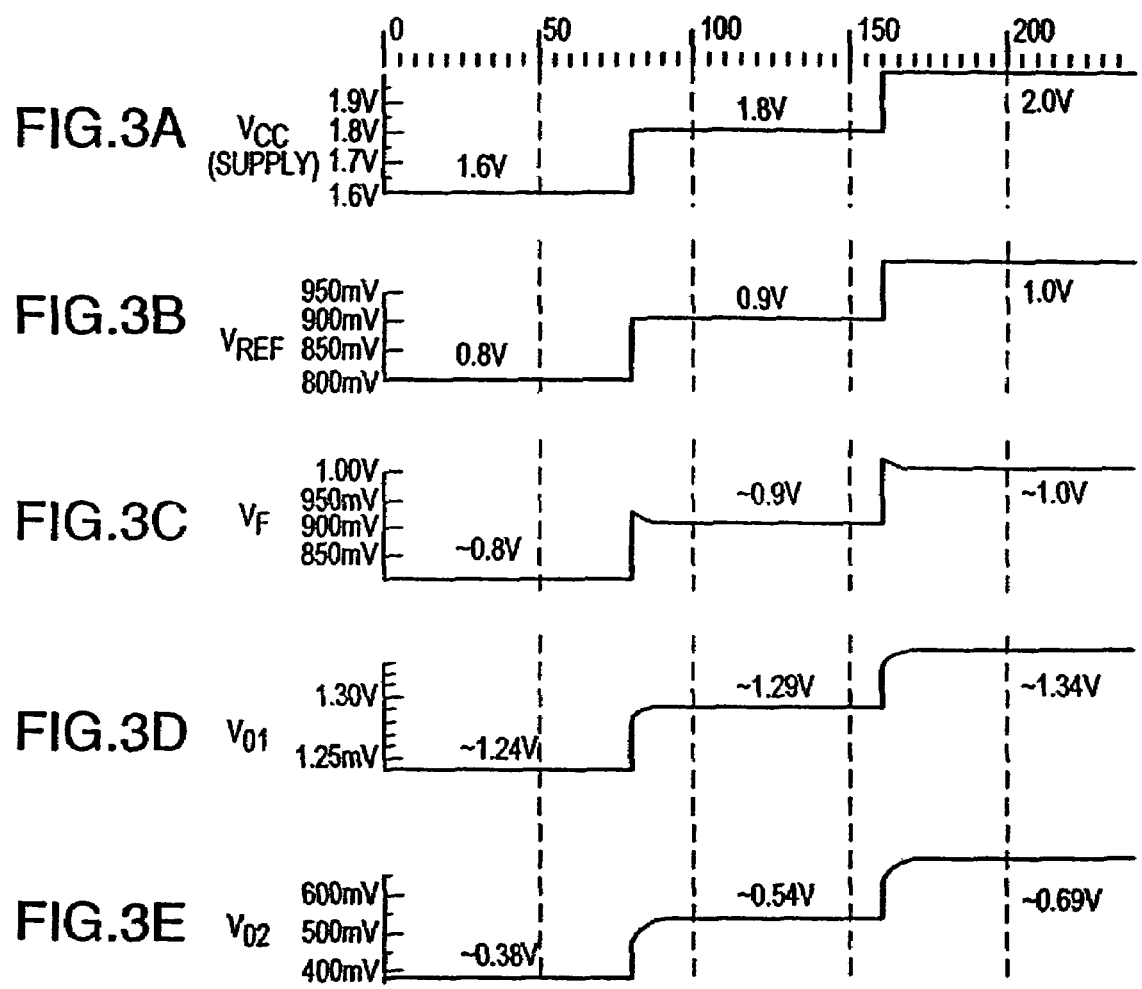

ACTIVE TERMINATION CIRCUIT AND METHOD FOR CONTROLLING THE IMPEDANCE OF EXTERNAL INTEGRATED CIRCUIT TERMINALS

CROSS-REFERENCE TO RELATED APPLICATIONS

This application is a continuation of U.S. patent application Ser. No. 10/999,771, filed Nov. 29, 2004, U.S. Pat. No. 7,106,638 which is a divisional of U.S. patent application Ser. No. 10/762,605, filed Jan. 21, 2004, U.S. Pat. No. 6,944,071, which is a continuation of U.S. patent application Ser. No. 10/375,639, filed Feb. 26, 2003, U.S. Pat. No. 6,711,073, which is a divisional of U.S. patent application Ser. No. 09/997,156, filed Nov. 28, 2001, U.S. Pat. No. 6,657,906.

TECHNICAL FIELD

The invention relates to integrated circuits, and, more particularly, to a method and circuit for efficiently controlling the input impedance of externally accessible integrated circuit terminals.

BACKGROUND OF THE INVENTION

Integrated circuits receive signals through externally accessible input terminals of various designs. In some integrated circuits, the magnitude of the input impedance of input terminals is not critical. Other integrated circuits, particularly memory devices operating at a high speed, the input impedance of at least some of the input terminal must be controlled for optimum performance.

FIG. 1 illustrates a conventional memory device that can advantageously use one or more embodiments of the active termination circuit in according to the present invention. The memory device shown in FIG. 1 is a synchronous dynamic random access memory ("SDRAM") 10, although the active termination circuit may also be used in other memory devices and other integrated circuits. The SDRAM 10 includes an address register 12 that receives either a row address or a column address on an address. bus 14 through an address input buffer 16. The address bus 14 is generally coupled to a memory controller (not shown). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26, which stores the row address, and a row decoder 28, which applies various signals to its respective memory bank 20 or 22 as a function of the stored row address. The row address multiplexer 18 also couples row addresses to the row address latches 26 to refresh memory cells in the memory banks 20, 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42 which applies a sequence of column addresses to the column address buffer 44 starting at the column address that is output by the address register 12. In either case, the column address buffer 44 supplies a column address to a column decoder 48 which applies various column signals to respective sense amplifiers and associated column circuitry 50, 52 for the respective memory banks 20, 22.

Data to be read from one of the memory banks 20, 22 are coupled to the column circuitry 50, 52 for one of the memory banks 20, 22, respectively. The data are then coupled to a data output register 56 which applies the data to a data bus 58 through a data input buffer 59 and a data output buffer 60. Data to be written to one of the memory banks 20, 22 are coupled from the data bus 58 through a data input register 62 to the column circuitry 50, 52 and then are transferred through word line driver circuits in the column circuitry 50, 52 to one of the memory banks 20, 22, respectively. A mask register 64 may be used to selectively alter the flow of data into and out of the column circuitry 50, 52, such as by selectively masking data to be read from the memory banks 20,22.

The above-described operation of the SDRAM 10 is controlled by a command decoder 68 responsive to high level command signals received on a control bus 70 and coupled to the command decoder through a command input buffer 72. These high level command signals, which are typically generated by a memory controller (not shown in FIG. 1), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 68 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted Each of the input buffers 16, 59, 72 includes a respective termination circuit 90 that is coupled to a respective externally accessible input terminal and that determines the input impedance of the input buffer. Conventional termination circuits 90 include, for example, resistors as well as NMOS and PMOS transistors that are biased to an ON condition. In the past, it has been difficult to efficiently control the input impedance of the input terminals. The resistance provided by transistors and other components can vary with process variations and operating temperature, thus making it difficult to precisely control input impedance. Process variations can be compensated for to some extent by altering the circuit topography during manufacturer using fusible links and the like. However, compensating for processing variations in this manner increases the number of components included in the termination circuit and may increase the number of manufacturing steps. Furthermore, compensating for process variations in does not compensate for temperature variations. Therefore, the input impedance can vary with changes in temperature. Another problem with conventional termination circuits using PMOS or NMOS transistors is that the effective impedance of the transistor varies with the source-to-drain voltage, thus making the impedance of the transistor sensitive to variations in the supply voltage.

A relatively complex circuit (not shown) can be used to implement an active termination circuit 90 that precisely controls the input impedance. However, providing a relatively complex termination circuit 90 for each of the many input terminals of a conventional integrated circuit, such as the SDRAM 10, greatly increases the amount of circuitry in the integrated circuit.

There is therefore a need for a circuit and method that uses relatively little circuitry and yet is able to precisely control the input impedance of an input terminal despite process, temperature and supply voltage variations.

SUMMARY OF THE INVENTION

An active termination circuit and method controls the input impedance of a plurality of externally accessible input terminals in an integrated circuit, such as a memory device. Each of the externally accessible input terminals are coupled to a respective first variable impedance device and a respective second variable impedance device. The impedance of one of the first variable impedance devices is compared to a first predetermined impedance by suitable means, such as by deriving a feedback signal from a voltage divider formed by the first variable impedance device and the first predetermined impedance. Similarly, the impedance of one of the second variable impedance devices is compared to a second predetermined impedance by suitable means, such as by deriving a feedback signal from a voltage divider formed by the second variable impedance device and the second predetermined impedance. Based on these comparisons, the impedances of all of the first variable impedance devices and all of the second variable impedance devices are adjusted. More specifically, the impedances of all of the first variable impedance device are adjusted so that they have a predetermined relationship to the first predetermined impedance, and the impedances of all of the second variable impedance device are adjusted so that they have a predetermined relationship to the second predetermined impedance. The variable impedances may each be a continuously varying impedance device, a plurality of fixed impedance devices selectively coupled in parallel with each other, or some other variable impedance device.

DETAILED DESCRIPTION OF THE INVENTION

Figure 1:
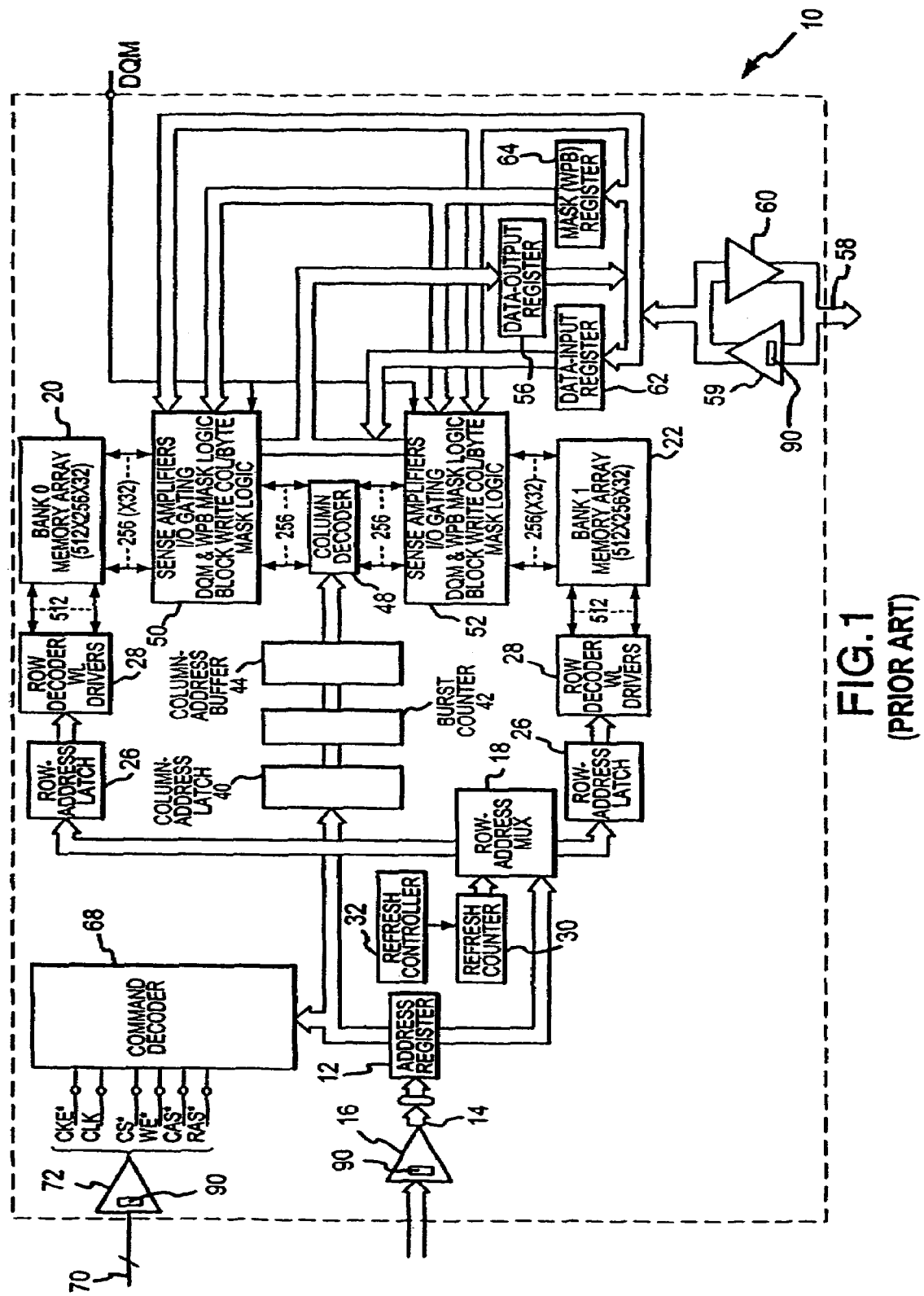
FIG. 1 is a block diagram of a conventional SDRAM integrated circuit having a termination circuit coupled to each input terminal for controlling the input impedance of the input terminal.
Figure 2:
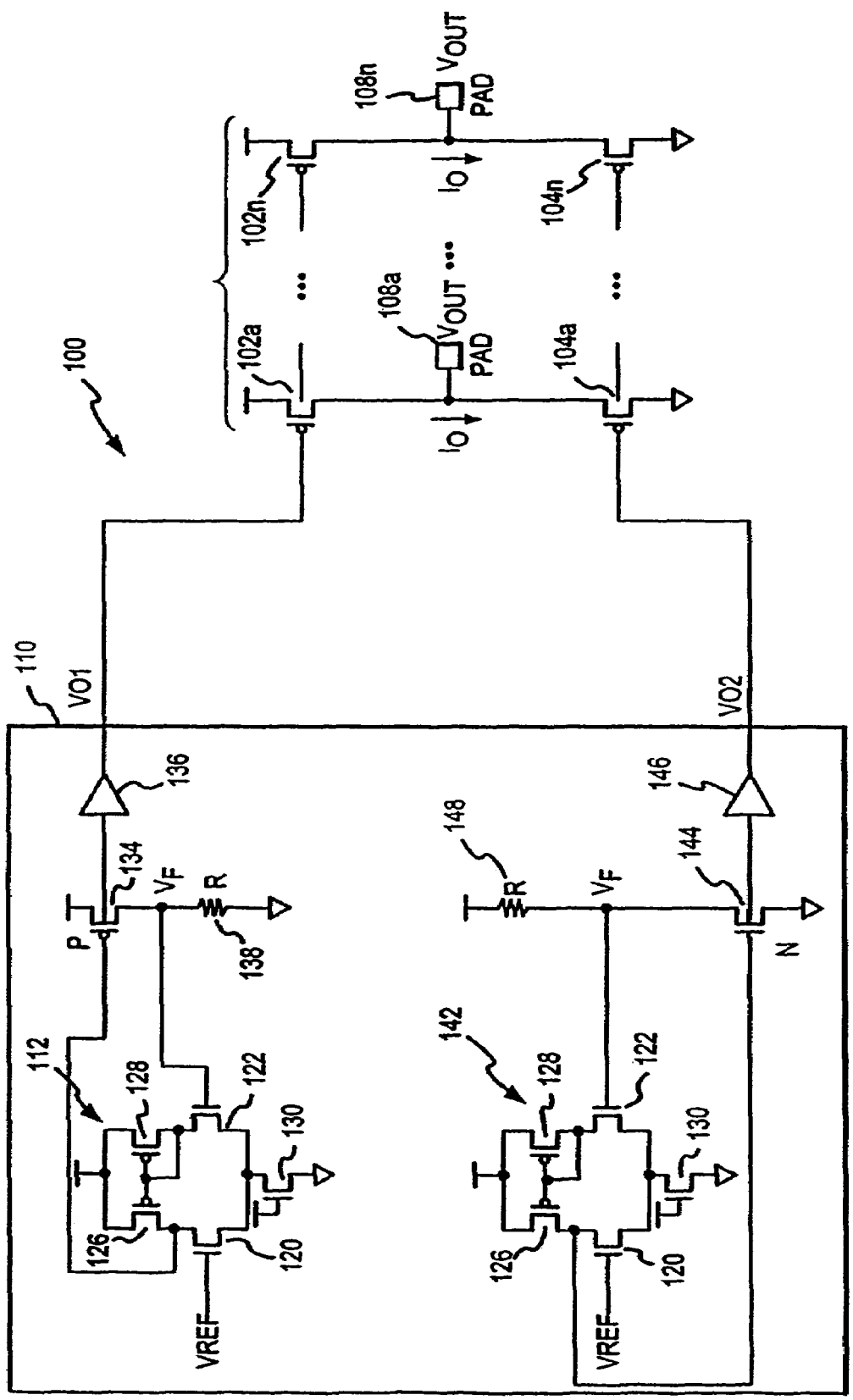
FIG. 2 is a schematic of a termination circuit according to one embodiment of the invention that may be used in the SDRAM of FIG. 1 or in another integrated circuit.

One embodiment of an active termination circuit 100 is shown in FIG. 2. The active termination circuit 100 is an analog circuit that includes a PMOS transistor 102a-n and an NMOS transistor 104a-n coupled to a respective one of a several input terminals 108a-n of an integrated circuit, such as the SDRAM 10 of FIG. 1. The gates of all of the PMOS transistors 102a-n are coupled to each other and to a first output of a control circuit 110, which provides a first output voltage $V_{O1}$. Similarly, the gates of all of the NMOS transistors 104a-n are coupled to each other and to a second output of the control circuit 110, which provides a second output voltage $V_{O2}$. By using only two transistors 102a-n, 104a-n for each input terminal 108a-n and a single control circuit 110 to provide signals to all of the transistors 102a-n, 104a-n, relatively little circuitry is required to control the input impedance of all of the input terminals 108a-n. The manner in which the output voltages $V_{O1}$ and $V_{O2}$ are adjusted to maintain a constant input impedance at the input terminals 108a-n despite process variations and variations in the temperature and supply voltage $V_{CC}$ will be explained with the explanation of the control circuit 110.

The control circuit 110 includes a differential amplifier 112 formed by a pair of NMOS input transistors 120, 122, a pair of PMOS load transistors 126, 128 coupled as a current mirror, and an NMOS transistor 130 that draws a constant current collectively through the input transistors 120, 122. An output of the differential amplifier 112 is coupled to the gate of a PMOS transistor 134 and to the input of a buffer 136. An output of the buffer 136 is coupled to the gate of each PMOS transistor 102a-n, as previously explained.

The PMOS transistor 134 is coupled in series with a resistor 138 between a supply voltage $V_{CC}$ and ground. The PMOS transistor 134 and resistor 138 form a voltage divider that generates a feedback voltage $V_F$, which is applied to the gate of the input transistor 122. The gate of the other input transistor 120 is coupled to a reference voltage $V_{REF}$, which may be one-half the supply voltage $V_{CC}$ but may also have other values.

The control circuit 110 also includes a second differential amplifier 142 that uses the same components as the differential amplifier 112 operating in the same manner and provided with the same reference numerals. A first output of the differential amplifier 142 is coupled to the gate of an NMOS transistor 144 and to the input of a buffer 146. The output of the buffer 146 is coupled to the gate of each NMOS transistor 104a-n, as also previously explained.

The NMOS transistor 144 is coupled in series with a resistor 148 between a supply voltage $V_{CC}$ and ground to form a voltage divider. A feedback voltage $V_F$ generated by the voltage divider is coupled to the gate of one input transistor 122 in the differential amplifier 142. The gate of the other input transistor 120 of the differential amplifier 142 is coupled to a reference voltage $V_{REF}$. Note, however, that the order of the PMOS transistor 134 and the resistor 138 forming the first voltage divider is the reverse of the order of the NMOS transistor 144 and the resistor 148 forming the second voltage divider. As a result, the first output voltage $V_{O1}$ decreases with increases in the resistance of the PMOS transistor 134 while the second output voltage $V_{O2}$ increases with increases in the resistance of the NMOS transistor 144.

In operation, the differential amplifier 112 adjusts the output voltage $V_{O1}$ so that the PMOS transistor 134 has a resistance that causes the feedback voltage $V_F$ to be equal to the reference voltage $V_{REF}$. If the reference voltage $V_{REF}$ is equal to one-half the supply voltage $V_{CC}$, the impedance of the PMOS transistor 134 will be equal to the resistance of the resistor 138. An increase in the impedance of the PMOS transistor 134 causes a decrease in the feedback voltage $V_F$, which will cause the differential amplifier 112 to decrease the output voltage $V_{O1}$. The reduced output voltage $V_{O1}$ coupled to the gate of the PMOS transistor 134 decreases the impedance of the PMOS transistor 134 so that the magnitude of the feedback voltage $V_F$ again equals the magnitude of the reference voltage $V_{REF}$.

The differential amplifier 142 operates in essentially the same manner to maintain the impedance of the NMOS transistor 144 equal to the resistance of the resistor 148. More specifically, any decrease in the impedance of the NMOS transistor 144 causes a decrease in the magnitude of the feedback voltage $V_F$. The differential amplifier 142 responds to the decreased feedback voltage $V_F$ by decreasing the output voltage $V_{O2}$, which causes the impedance of the NMOS transistor 144 to increase until the magnitude of the feedback voltage $V_F$ is again equal to the magnitude of the reference voltage $V_{REF}$.

Although the control circuit 110 has been explained with respect to the magnitude of the reference voltage $V_{REF}$ being one-half the magnitude of the supply voltage $V_{CC}$, it will be understood that the magnitude of the reference voltage and the supply voltage may have other relationships. For example, if the magnitude of the reference voltage $V_{REF}$ is equal to two-thirds of the supply voltage $V_{CC}$, the impedance of the PMOS transistor will be one-half the resistance of the resistor 138, and the impedance of the NMOS transistor 144 will be one-half the resistance of the resistor 148. As long as the resistance of the resistors 138, 148 are equal to each other, the impedance of the PMOS transistor 134 will still be equal to the impedance of the NMOS transistor 144.

Although the electrical characteristics of the PMOS transistors-102a-n and the NMOS transistors 104a-n may vary with process variations, temperature and supply voltage the same electrical characteristics of the PMOS transistor 134 and the NMOS transistor 144 can be expected to vary with process variations in substantially the same manner. Therefore, the active termination circuit 100 will be substantially insensitive to process, temperature and supply voltage variations.

Figure 3F:
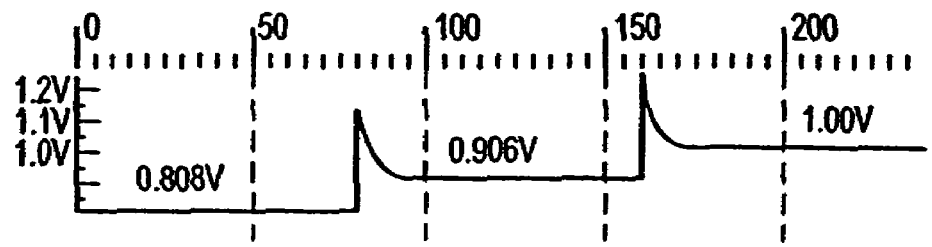
FIG. 3 is a waveform diagram showing the voltages at the various nodes in the termination circuit of FIG. 2 responsive to variations in the level of a supply voltage.
Figure 3G:
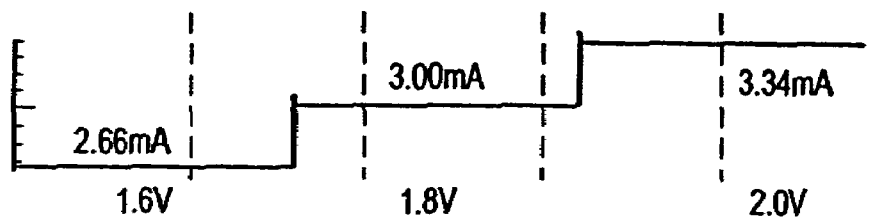

The manner in which the active termination circuit 100 is insensitive to variations in the supply voltage $V_{CC}$ will now be explained with reference to FIGS. 3A-G. When the supply voltage $V_{CC}$ is 1.6 volts as shown in FIG. 3A and the reference voltage $V_{REF}$ is one-half $V_{CC}$, or 0.8 volts, as shown in FIG. 3B, the feedback voltage $V_F$ will also be one-half $V_{CC}$, or 0.8 volts, as shown in FIG. 3C. In such case, the output voltage $V_{O1}$ will be adjusted by the differential amplifier 112 to 1.24 volts, as shown in FIG. 3D, which is the voltage needed to make the impedance of the PMOS transistor 134 equal to the resistance of the resistor 138. In a similar manner, the differential amplifier 142 will generate a voltage $V_{O2}$ of 0.38 volts, as shown in FIG. 3E, which is the voltage needed to make the impedance of the NMOS transistor 144 equal to the resistance of the resistor 148. The impedance of the PMOS transistors 102 will then be approximately equal to the impedance of the NMOS transistors 104, so that the voltage $V_{OUT}$ on the input terminals 108 will be equal to approximately one-half $V_{CC}$, or 0.8 volts. As shown in FIG. 3F, in one embodiment this voltage is 0.808 volts. Finally, the current 10 through each series combination of a PMOS transistor 102 and a respective NMOS transistor 104 will be 2.66 ma, as shown in FIG. 3G.

The impedance of each PMOS transistor 102 and each NMOS transistor 104 is equal to the voltage across each of the transistors 102, 104 divided by the current through the transistors 102, 104. For the PMOS transistors 102, the voltage across the transistors 102 is 0.792 volts, so that the impedance of the PMOS transistors 102 can be calculated by the ratio of 0.792 volts to 2.66 ma as 298 ohms. In a similar manner, the impedance of the NMOS transistors 104 can be calculated as the ratio of the 0.808 volts across the transistors 104 to the 2.66 ma of current through the transistors 104, or 304 ohms. The input impedance of the input terminals 108 will thus be the impedance of the two transistors 102, 104 in parallel, or substantially 150 ohms.

If the supply voltage $V_{CC}$ increases to 1.8 volts as shown in FIG. 3A, the reference voltage and the feedback voltage will increase accordingly so that the differential amplifier 112 will then generate an output voltage $V_{O1}$ equal to 1.29 volts and the differential amplifier 142 will generate an output voltage $V_{O2}$ equal to 0.54 volts, as shown in FIGS. 3D and E, respectively. Although the voltage applied to the gate of the PMOS transistor 134 increases from 1.24 volts to 1.29 volts, i.e., by 0.05 volts, the supply voltage VCC has increased to a greater extent, i.e. from 1.6 volts to 1.8 volts, or an increase in 0.2 volts. As a result, the gate-to-source of voltage of the PMOS transistor 134 increases by 0.15 volts, i.e. 0.2 volts less 0.05 volts. This increased gate to-source of voltage increases the current through the transistor 134 to 3 ma, as shown in FIG. 3G. However, since the voltage on the input terminal 108 has increased to 0.906 volts, as shown in FIG. 3F, the voltage across the PMOS transistor 134 has increased to 0.894 volts. The impedance of the PMOS transistors 102 can then be calculated by the ratio of 0.894 volts to 3 ma as 2.98 ohms, which is the same impedance previously calculated for a supply voltage $V_{CC}$ of 1.6 volts. Similarly, the impedance of each NMOS transistor 104 can be calculated by the ratio of the 0.906 volts across the transistor 104 to the 3 ma of current through the transistor 104 as 302 ohms, which is substantially the same impedance as the 304 ohms calculated for a supply voltage $V_{CC}$ of 1.6 volts.

If the supply voltage $V_{CC}$ increases to 2 volts as shown in FIG. 3A, the impedance of each PMOS transistor 102 can be calculated in the same manner as described above to be 2.99 ohms, i.e., 1 volt across the transistor 102 divided by 3.34 ma. The impedance of each NMOS transistor 104 can be calculated in the same manner as described above to also be 2.99 ohms, i.e., 1 volt across the transistor 104 divided by 3.34 ma. It can therefore be seen that the input impedance at each input terminal 108 is substantially insensitive to variations in the supply voltage $V_{CC}$.

Figure 4:
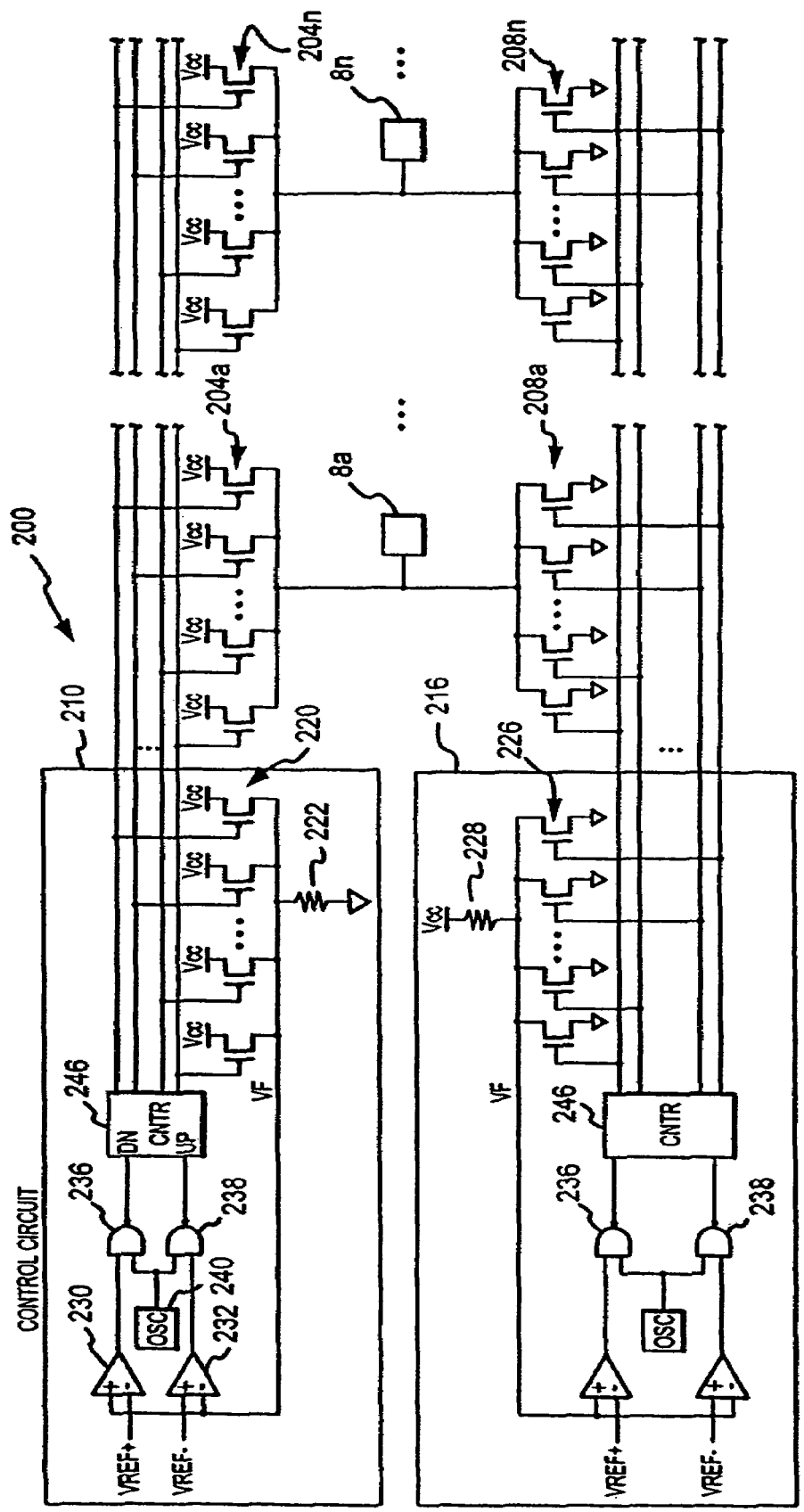
FIG. 4 is a schematic of a termination circuit according to another embodiment of the invention that may be used in the SDRAM of FIG. 1 or in another integrated circuit.

Another embodiment of an active termination circuit 200 is shown in FIG. 4. Unlike the analog active termination circuit 100 of FIG. 2, the active termination circuit of FIG. 4 is a digital circuit. Each input terminal 8a-n is coupled to the drains of a set of PMOS transistors 204a-n that are coupled to each other in parallel, and to the drains of a set of NMOS transistors 208a-n that are coupled to each other in parallel. The sources of the PMOS transistors 204a-n are coupled to a supply voltage $V_{CC}$ while the sources of the NMOS transistors 208a-n are coupled to ground. The gates of the PMOS transistors 204a-n are coupled to a first control circuit 210 while the gates of the NMOS transistors 208a-n are coupled to a second control circuit 216.

In operation, the voltage at each input terminal 8a-n is determined by the impedance of the parallel combination of PMOS transistors 204a-n relative to the impedance of the parallel combination of NMOS transistors 208a-n. A set of PMOS transistors 204a-n and a set of NMOS transistors 208a-n are provided for each input terminal 8a-n. The input impedance at the input terminal 8a-n is determined by the parallel combination of the PMOS transistors 204a-n and the parallel combination of the NMOS transistors 208a-n in parallel with each other. As explained in detail below, the first control circuit 210 selectively turns ON a plurality of the PMOS transistors 204a-n and the second control circuit 216 selectively turns ON a plurality of the NMOS transistors 208a-n so that both the impedance of the parallel combination of PMOS transistors 204a-n and the impedance of the parallel combination of NMOS transistors 208a-n are substantially equal to a predetermined impedance. As a result, the input impedance at the input terminal 8a-n are set to predetermine values.

The first control circuit 210 and the second control circuit 216 are substantially identical in structure and function. The only significant difference between the first control circuit 210 and the second control circuit 216 is that the first control circuit 210 includes a parallel combination of PMOS transistors 220 coupled between the supply voltage $V_{CC}$ and a resistor 222 that is coupled to ground, while the second control circuit 216 includes a parallel combination of NMOS transistors 226 coupled between ground and a resistor 228 that is coupled to the supply voltage $V_{CC}$.

Each of the control circuits 210, 216 includes a first comparator 230 and a second comparator 232. A feedback voltage $V_F$ is applied to the "+" input of the first comparator 230 into the "−" input of the second comparator 232. The first comparator 230 also receives a first reference voltage $V_{REF+}$ while the second comparator 232 also receives a second reference voltage $V_{REF-}$. The magnitude of the first reference voltage $V_{REF+}$ is slightly larger than the magnitude of the second reference voltage $V_{REF-}$. As explained below, the difference between the magnitude of the first reference voltage and the magnitude of the second reference voltage $V_{REF-}$ establishes a deadband. In the active termination circuit 200 of FIG. 4, the deadband is preferably centered at a voltage that is approximately one-half the supply voltage $V_{CC}$. When the feedback voltage $V_F$ is within the deadband, the number of transistors 220, 226 that are switched ON does not change. When the feedback voltage $V_F$ is outside the deadband, the number of transistors 220, 226 that are switched ON is either increased or decreased depending upon whether the feedback voltage $V_F$ is above or below the deadband.

Outputs from the comparators 230, 232 are applied to an input of a respective NAND-gate 236, 238. An input of each NAND-gate 236, 238 also receives an output from an oscillator 240. Respective outputs from the NAND-gates 236, 238 are applied to an up/down counter 246. However, the output from the NAND-gate 236 is applied to the "DN" input of the counter 246 in the first control circuit 210 and to the "UP" input of the counter 246 in the second control circuit 216. Also, the output from the NAND-gate 238 is applied to the "UP" input of the counter 246 in the first control circuit 210 and to the "DN" input of the counter 246 in the second control circuit 216.

The operation of the control circuits 210, 216 will now be explained with initial reference to the first control circuit 210. When the magnitude of the feedback voltage $V_F$ is greater than the magnitude of the reference voltage $V_{REF+}$, the NAND-gate 236 is enabled by a high output from the comparator 230 resulting from the positive comparison between the feedback voltage $V_F$ and the reference voltage $V_{REF+}$. As a result, pulses from the oscillator 240 are coupled through the NAND-gate 236 to the "DN" input of the counter 246. The counter 246 then decrements its count. The ON impedance of the PMOS transistors 220 preferably vary from each other in a binary manner so that the ON impedance of the leftmost PMOS transistor 220 is one-half the ON impedance of the PMOS transistor 220 to its right, and the ON impedance of the rightmost PMOS transistor 220 is twice the ON impedance of the PMOS transistor 22Q to its left. The PMOS transistors 204a-n coupled to the input terminals 108a-n vary in the same manner. As a result, the impedance of the parallel combination of PMOS transistors 220 and 204a-n will correspond to the count of the counter 246. Therefore, when the counter 246 is decremented responsive to the feedback voltage $V_F$ being greater than the reference voltage $V_{REF+}$, as previously explained, the impedance of the parallel combination of PMOS transistors 220 and 204a-n is increased. When the impedance of the PMOS transistors 220 is increased, the feedback voltage $V_F$ will be reduced to some voltage that is within the deadband.

The control circuit 210 responds to the feedback voltage $V_F$ being below the deadband in a similar manner. Specifically, when the magnitude of the feedback voltage $V_F$ is less than the magnitude of the reference voltage $V_{REF-}$, the NAND-gate 238 is enabled by the positive comparison between the reference voltage $V_{REF-}$ and the feedback voltage $V_F$. As result, pulses from the oscillator 240 are gated to the "UP" input of the counter 246. The count of the counter 246 is then incremented, thereby turning ON additional PMOS transistors 220 and 204a-n. The additional PMOS transistors 220 that are turned ON increase the feedback voltage until it is at a voltage that is within the deadband.

As mentioned above, the deadband is preferably centered at one-half the magnitude of the supply voltage $V_{CC}$. When the feedback voltage $V_F$ is centered in the deadband, i.e. is at one-half $V_{CC}$, the impedance of the parallel combination of PMOS transistors 220 and 204a-n will be equal to the resistance of the resistor 222. The PMOS transistors 204a-n coupled to the input terminals 8a-n are identical to and fabricated in the same process as the PMOS transistors 220. The impedance of each parallel combination of PMOS transistors 204a-n will therefore also be equal to the resistance of the resistor 222.

The control circuit 216 operates in substantially the same manner as the control circuit 210. As in the control circuit 210, when the magnitude of the feedback voltage $V_F$ is greater than the magnitude of the reference voltage $V_{REF+}$, the NAND-gate 236 will be enabled, and when the magnitude of the feedback voltage $V_F$ is less than the magnitude of the reference voltage $V_{REF-}$, the NAND-gate 238 will be enabled. When the magnitude of the feedback voltage $V_F$ is greater than the magnitude of the reference voltage $V_{REF+}$, the counter 246 will be incremented to increase the number of NMOS transistors 226 that are turned ON. The impedance of the parallel combination of NMOS transistors 226 and 208a-n will therefore be decreased, which will reduce the magnitude of the feedback voltage $V_F$ so that it is within the deadband. When the magnitude of the feedback voltage $V_F$ is less than the magnitude of the reference voltage $V_{REF-}$, the counter 246 will be decremented to decrease the number of NMOS transistors 226 that are turned ON. The impedance of the parallel combination of NMOS transistors 226 and 208a-n will therefore be increased, which will increase the magnitude of the feedback voltage $V_F$ so that it is within the deadband. In this manner, the impedance of the parallel combination of NMOS transistors 226 and 208a-n, will be set to equal the resistance of the resistor 228. Assuming the resistances of the resistors to 222, 228 are equal to each other, the impedance of each parallel combination of PMOS transistors 204a-n coupled to a respective input terminal 8a-n will be equal to the impedance of the parallel combination of NMOS transistors 208a-n coupled to the same input terminal 8a-n.

As with the active termination circuits 100 of FIG. 2, the active termination circuit 200 of FIG. 4 can precisely control the impedance and bias voltage level at each input terminal 8a-n using only a single pair of control circuits 210, 216 for all of the input terminals 8a-n. Furthermore, as long as the reference voltages track changes in the supply voltage $V_{CC}$, such as by being generated from the supply voltage $V_{CC}$ using a voltage divider, the input impedance at each input terminal 8a-n will be insensitive to changes in the supply voltage $V_{CC}$. Finally, since the PMOS transistors 204a-n are identical to and fabricated in the same process as the PMOS transistors 220, and the NMOS transistors 208a-n are identical to and fabricated in the same process as the NMOS transistors 226, the impedance at each input terminal 8a-n are substantially insensitive to process variations.

Figure 5:
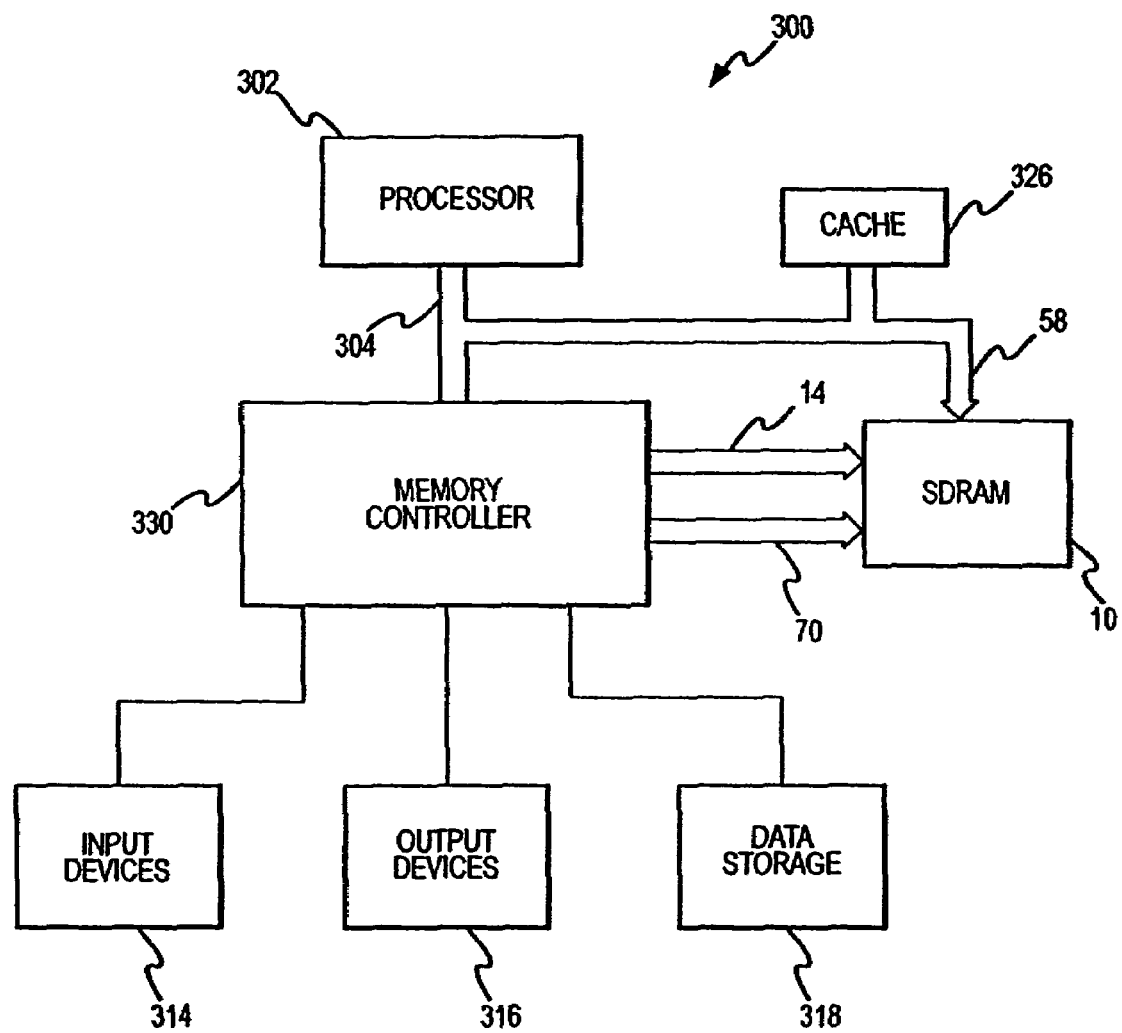
FIG. 5 is a block diagram of a computer system using the memory device of FIG. 1 containing the active termination circuit of either FIG. 2 or FIG. 3.

FIG. 5 illustrates an example of a computer system 300 using the SDRAM 10 of FIG. 1 with active termination circuits coupled to at least some of its externally accessible input terminals according to one embodiment of the invention. the computer system includes a processor 302 for performing various computing functions, such as executing specific software to perform specific calculations or tasks. The processor 302 includes a processor bus 304 that normally includes the address bus 14, the data bus 58, and the control bus 70. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devises 318 are also typically coupled to the processor 302 to allow the processor 302 to store data or retrieve data from internal or external storage media (not shown). Examples of typical storage devices 318 include hard and floppy disks, tape cassettes and compact disk read-only memories (CDROMs). The processor 302 is also typically coupled to cache memory 326, which is usually static random access memory ("SRAM") and to the SDRAM 10 through a memory controller 330. The memory controller 330 normally includes the control bus 70 and the address bus 14 that is coupled to the SDRAM 10. The data bus 58 may be coupled to the processor bus 304 either directly (as shown), through the memory controller 330, or by some other means. Although the computer system 300 shown in FIG. 5 uses SDRAM memory devices, it will be understood that computer systems may alternatively use other types of memory devices having externally accessible input terminals that are coupled to an active termination circuit according to various embodiments of the invention. Also, the input terminals of the processor 302 may include active termination circuit according to various embodiments of the invention.

From the foregoing it will be appreciated that, although specific embodiments of the invention have been described herein for purposes of illustration, various modifications may be made without deviating from the spirit and scope of the invention. For example, it may be possible to use a fixed impedance element, such as a resistor, having a relatively high impedance coupled to the power supply voltage in place of either the PMOS transistor(s) or coupled to ground in place of either the NMOS transistor(s). The impedance of the input terminal could then be controlled by the lower impedance NMOS or PMOS transistor(s). Accordingly, the invention is not limited except as by the appended claims.

The invention claimed is:

1. A memory device, comprising:
   a plurality of externally-accessible terminals;
   a command decoder configured to receive memory command signals through at least one of the externally accessible terminals, the command decoder configured to generate memory control signals responsive to predetermined combinations of the command signals;
   an address decoder configured to receive address signals through at least one of the externally accessible terminals, the address decoder configured to generate row and column addressing signals responsive to the address signals;
   at least one memory array, the at least one memory array configured to write data to and read data from locations corresponding the address signals responsive to the memory control signals;
   a data path extending between at least one of the plurality of externally accessible terminals and the memory array and configured to couple data signals to and from the memory array; and
   an active termination circuit configured to set the input impedance of a first plurality of the externally accessible terminals to a predetermined value, the active termination circuit comprising:
      a respective first controllable impedance device coupled between a first supply voltage and each of the externally accessible terminals in the first plurality, each of the first controllable impedance devices configured to receive an impedance control signal, an impedance of the first controllable impedance devices based at least in part on the impedance control signal;
      a second controllable impedance device coupled between a second supply voltage and a feedback node, the second controllable impedance device being a different controllable impedance device from the first controllable impedance devices, and the feedback node being different from one of the externally accessible terminals, the impedance of the second controllable impedance device based at least in part on the impedance control signal;
      a resistance coupled between the feedback node and a third supply voltage, the second controllable impedance device and the resistance configured to produce a feedback voltage at the feedback node; and
      circuitry configured to generate the impedance control signal based at least in part on the feedback voltage.

2. The memory device of claim 1 wherein the circuit configured to generate the impedance control signal comprises a comparator circuit configured to compare the feedback voltage to a reference voltage, the comparator circuit configured to vary the impedance control signal so that the feedback voltage is substantially equal to the reference voltage.

3. The memory device of claim 2 wherein the comparator circuit comprises a first differential amplifier configured to generate a comparison signal based in part on a difference between the feedback voltage and the reference voltage, the impedance control signal corresponding to the comparison signal.

4. The memory device of claim 1 wherein the control circuit is operable to provide a common impedance control signal to all of the respective first controllable impedance devices.

5. The memory device of claim 1 wherein the first and second supply voltages have the same magnitude.

6. The memory device of claim 5 wherein the first and second supply voltages comprise a power supply voltage.

7. The memory device of claim 6 wherein the third supply voltage comprises ground potential.

8. The memory device of claim 1 wherein the control circuit is operable to generate the impedance control signal to maintain the impedance of the second controllable impedance device substantially equal to the impedance of the resistance.

9. The memory device of claim 1 wherein the at least one of the first controllable impedance devices and the second controllable impedance device comprise identical controllable impedance devices.

10. The memory device of claim 9 wherein at least one of the first controllable impedance devices and the second controllable impedance device comprise identical MOSFET transistors.

11. The memory device of claim 1 wherein at least one of the first and second controllable impedance devices comprises respective voltage controlled impedance devices.

12. The memory device of claim 1 wherein the command and address signals are coupled to the memory device in a packet containing both the command signals and the address signals.

13. The memory device of claim 1 wherein the memory device comprises a dynamic random access memory.

14. The memory device of claim 13 wherein the dynamic random access memory comprises a synchronous dynamic random access memory.

* * * * *

UNITED STATES PATENT AND TRADEMARK OFFICE
CERTIFICATE OF CORRECTION

PATENT NO. : 7,715,256 B2
APPLICATION NO. : 11/329596
DATED : May 11, 2010
INVENTOR(S) : Chris G. Martin It is certified that error appears in the above-identified patent and that said Letters Patent is hereby corrected as shown below:

col. 1, ll. 30, 32
\*\*Integrated circuits receive signals through externally accessible input terminals of various designs. In some integrated circuits, the magnitude of the input impedance of input terminals is not critical~~.~~ with ~~O~~other integrated circuits, particularly memory devices operating at a high speed, the input impedance of at least some of the input terminals must be controlled for optimum performance.\*\* col. 1, l. 36
\*\*FIG. 1 illustrates a conventional memory device that can advantageously use one or more embodiments of the active termination circuit ~~in~~ according to the present invention.\*\* col.. 2, l. 54
\*\*Furthermore, compensating for process variations ~~in~~ does not compensate for temperature variations\*\* col. 3, ll. 1, 2
\*\*There is therefore a need for a circuit and method that uses relatively little circuitry and yet ~~is~~are able to precisely control the input impedance of an input terminal despite process, temperature and supply voltage variations.\*\* col. 3, ll. 8, 12
\*\*An active termination circuit and method controls the input impedance of a plurality of externally accessible input terminals in an integrated circuit, such as a memory device. Each of the externally accessible input terminals ~~are~~is coupled to a respective first variable impedance device and a respective second variable impedance device.\*\*

Signed and Sealed this
Nineteenth Day of April, 2011

David J. Kappos
*Director of the United States Patent and Trademark Office*

CERTIFICATE OF CORRECTION (continued)
U.S. Pat. No. 7,715,256 B2 col. 3, ll. 27, 30
\*\*More specifically, the impedances of all of the first variable impedance device<u>s</u> are adjusted so that they have a predetermined relationship to the first predetermined impedance, and the impedances of all of the second variable impedance device<u>s</u> are adjusted so that they have a predetermined relationship to the second predetermined impedance.\*\* col. 5, l. 19
\*\*As long as the resistance of the resistors 138, 148 ~~are~~<u>is</u> equal to each other, the impedance of the PMOS transistor 134 will still be equal to the impedance of the NMOS transistor 144\*\* col. 6, l. 66
\*\*As a result, the input impedance<u>s</u> at the input terminal 8a-n are set to predetermine values.\*\* col. 7, l. 54
\*\*The ON impedance of the PMOS transistors 220 preferably var~~y~~<u>ies</u> from each other in a binary manner so that the ON impedance of the leftmost PMOS transistor 220 is one-half the ON impedance of the PMOS transistor 220 to its right, and the ON impedance of the rightmost PMOS transistor 220 is twice the ON impedance of the PMOS transistor 22Q to its left.\*\* col. 8, l. 10
\*\*As <u>a</u> result, pulses from the oscillator 240 are gated to the "UP" input of the counter 246. The count of the counter 246 is then incremented, thereby turning ON additional PMOS transistors 220 and 204a-n.\*\* col. 9, l. 2
\*\*Finally, since the PMOS transistors 204a-n are identical to and fabricated in the same process as the PMOS transistors 220, and the NMOS transistors 208a-n are identical to and fabricated in the same process as the NMOS transistors 226, the impedance at each input terminal 8a-n ~~are~~ <u>is</u> substantially insensitive to process variations.\*\* col. 9, l. 7
\*\*~~t~~<u>T</u>he computer system includes a processor 302 for performing various computing functions, such as executing specific software to perform specific calculations or tasks.\*\* col. 9, l. 37
\*\*Also, the input terminals of the processor 302 may include active termination circuit<u>s</u> according to various embodiments of the invention.\*\*

CLAIMS col. 9, l. 66
\*\*1. A memory device, comprising: a plurality of externally-accessible terminals; a command decoder configured to receive memory command signals through at least one of the externally accessible terminals, the command decoder configured to generate memory control signals responsive to predetermined combinations of the command signals; an address decoder configured to receive address signals through at least one of the externally accessible terminals, the address decoder configured to generate row and column addressing signals responsive to the address signals; at least one memory array, the at least one memory array configured to write data to and read data from locations corresponding to the address signals responsive to the memory control signals;**

col. 10, l. 30
    2. The memory device of claim 1 wherein the circuitry configured to generate the impedance control signal comprises a comparator circuit configured to compare the feedback voltage to a reference voltage, the comparator circuit configured to vary the impedance control signal so that the feedback voltage is substantially equal to the reference voltage.